United States Patent
Subbareddy et al.

(10) Patent No.: US 12,422,477 B2
(45) Date of Patent: Sep. 23, 2025

(54) SEGMENTED ROW REPAIR FOR PROGRAMMABLE LOGIC DEVICES

(71) Applicant: Intel Corporation, Santa Clara, CA (US)

(72) Inventors: Dheeraj Subbareddy, Portland, OR (US); Arun Jangity, Sunnyvale, CA (US); Ramya Yeluri, Mountain View, CA (US); Mahesh K. Kumashikar, Bangalore (IN); Atul Maheshwari, Portland, OR (US); Ankireddy Nalamalpu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 763 days.

(21) Appl. No.: 17/559,322

(22) Filed: Dec. 22, 2021

(65) Prior Publication Data

US 2022/0113350 A1    Apr. 14, 2022

(51) Int. Cl.
*G01R 31/3177* (2006.01)
*G06F 11/16* (2006.01)
*G06F 11/20* (2006.01)

(52) U.S. Cl.
CPC .......... *G01R 31/3177* (2013.01); *G06F 11/16* (2013.01); *G06F 11/202* (2013.01); *G06F 11/2043* (2013.01); *G06F 11/2046* (2013.01); *G06F 11/2048* (2013.01); *G06F 11/2094* (2013.01)

(58) Field of Classification Search
CPC ... G01R 31/3177; G06F 11/202; G06F 11/16; G06F 11/2043; G06F 11/2046; G06F 11/2048; G06F 11/2094
USPC ................. 714/725, 710, 711, 718
See application file for complete search history.

(56) References Cited

U.S. PATENT DOCUMENTS

| | | | |
|---|---|---|---|
| 6,222,382 B1* | 4/2001 | Jefferson | H03K 19/17728 326/38 |
| 6,965,249 B2* | 11/2005 | Lane | H03K 19/17744 326/41 |
| 7,215,140 B1* | 5/2007 | Saini | H03K 19/17764 326/12 |
| 7,772,872 B2* | 8/2010 | Lewis | H03K 19/17736 326/41 |
| 10,833,679 B2 | 11/2020 | Clark et al. | |
| 2003/0072185 A1* | 4/2003 | Lane | H03K 19/17736 365/230.02 |
| 2016/0049941 A1 | 2/2016 | How et al. | |
| 2022/0113350 A1* | 4/2022 | Subbareddy | G06F 11/202 |

* cited by examiner

*Primary Examiner* — John J Tabone, Jr.
(74) *Attorney, Agent, or Firm* — Fletcher Yoder, P.C.

(57) ABSTRACT

Systems or methods of the present disclosure may provide a programmable logic device including multiple logic array blocks each having multiple programmable elements. The multiple logic array blocks are arranged in multiple rows that are segmented into multiple segments. The programmable logic device also includes repair circuitry disposed between the multiple segments. The repair circuitry remaps logic within a first segment of the multiple segments when a first logic array block of the multiple logic array blocks has failed. Moreover, the first segment includes the first logic array block.

20 Claims, 8 Drawing Sheets

SEGMENTED ROW REPAIR FOR PROGRAMMABLE LOGIC DEVICES

BACKGROUND

The present disclosure relates generally to segmented row repair for programmable logic devices. More particularly, the present disclosure relates to using row repair to repair a segment of a row of logic access blocks (LABs) instead of repairing a whole line.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

An integrated circuit device that contains programmable logic fabric provides a highly flexible platform that can be configured after manufacturing with a custom circuit design. The flexibility and variability in the possible designs that may be programmed into this type of integrated circuit, however, also provides for different sectors of logic array blocks (LABs) of the integrated circuit to be used for different purposes and functions. As the integrated circuit is programmed to perform various operations, one or more LABs may fail during or after manufacture. To correct such failure, an additional row of LABs may be provided as a repair row. However, if LABs in multiple rows fail (e.g., more failed rows than redundant rows), the integrated circuit device may become unreliable and/or unusable.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present systems and techniques relate to embodiments repairing a row of logic array blocks (LABs) of programmable elements of a programmable fabric in segments of rows rather than in an entire row. By implementing the repairs in segments of rows rather than the entire row, an integrated circuit device that includes a programmable fabric may perform more repairs when the failing LABs occur in different segments without adding expensive additional spare rows. Each segmented area of LAB rows is treated as a set of LAB rows that can be repaired. A multiplexer structure between the segmented areas enables the LAB rows to be repaired independently.

In other words, by reducing the size of the repairable element of the programmable fabric, the number of repairs possible repairs increased by merely adding more multiplexers rather than additional LAB rows. By enabling more repairs of LABs, an integrated circuit device with a segmented repair circuitry for its programmable fabric may have a significantly higher yield than an integrated circuit device that has whole row repair circuitry without the expense of additional spare rows of LABs. This resulting higher yield for a programmable logic device (e.g., field-programmable gate array (FPGA)) die at the same level of density of underlying process defects. This is particularly true for large die size. Furthermore, the availability of additional repairs may prolong the expected life of the integrated circuit device.

Figure 1:
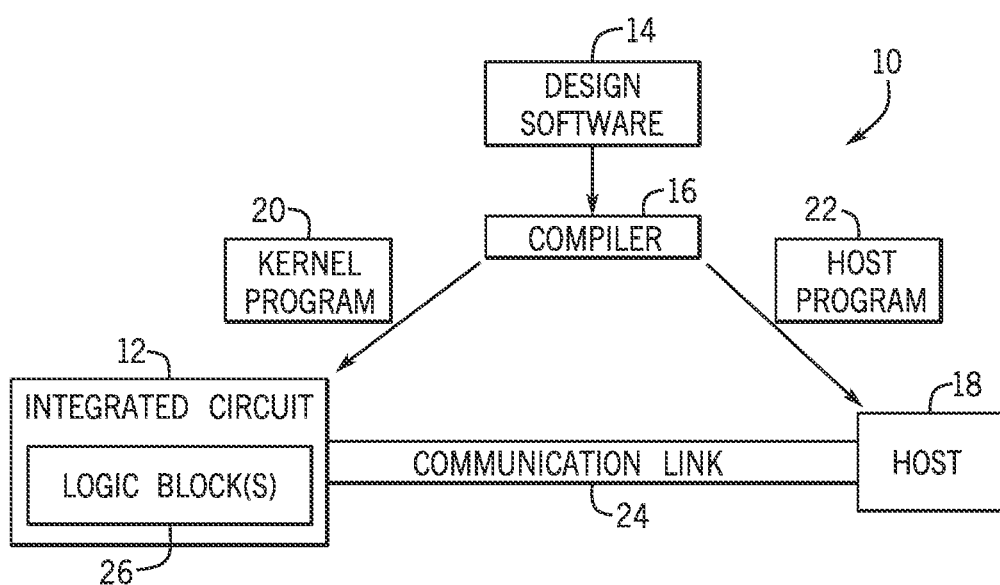
FIG. 1 is a block diagram of a system used to program an integrated circuit device, in accordance with an embodiment of the present disclosure.

With the foregoing in mind, FIG. 1 illustrates a block diagram of a system 10 that may implement arithmetic operations. A designer may desire to implement functionality, such as the operations of this disclosure, on an integrated circuit device 12 (e.g., a programmable logic device, such as a field programmable gate array (FPGA) or an application specific integrated circuit (ASIC)). In some cases, the designer may specify a high-level program to be implemented, such as an OPENCL® program, which may enable the designer to more efficiently and easily provide programming instructions to configure a set of programmable logic cells for the integrated circuit device 12 without specific knowledge of low-level hardware description languages (e.g., Verilog or VHDL). For example, since OPENCL® is quite similar to other high-level programming languages, such as C++, designers of programmable logic familiar with such programming languages may have a reduced learning curve than designers that are required to learn unfamiliar low-level hardware description languages to implement new functionalities in the integrated circuit device 12.

The designer may implement high-level designs using design software 14, such as a version of INTEL® QUARTUS® by INTEL CORPORATION. The design software 14 may use a compiler 16 to convert the high-level program into a lower-level description. In some embodiments, the compiler 16 and the design software 14 may be packaged into a single software application. The compiler 16 may provide machine-readable instructions representative of the high-level program to a host 18 and the integrated circuit device 12. The host 18 may receive a host program 22 which may be implemented by the kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of a logic block 26 on the integrated circuit device 12. The logic block 26 may include circuitry and/or other logic elements and may be configured to implement arithmetic operations, such as addition and multiplication.

The designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
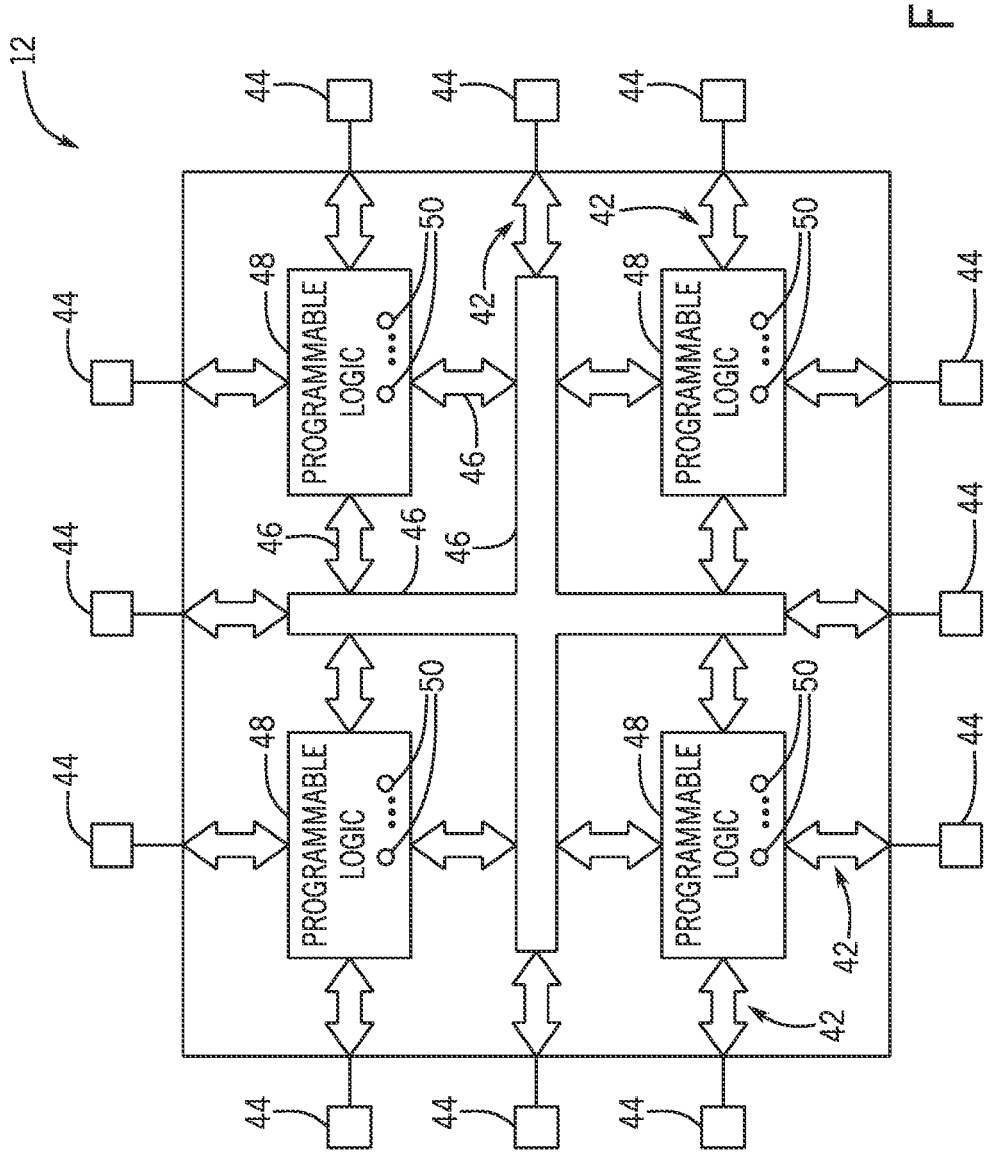
FIG. 2 is a block diagram of the integrated circuit device of FIG. 1, in accordance with an embodiment of the present disclosure.

Turning now to a more detailed discussion of the integrated circuit device 12, FIG. 2 is a block diagram of an example of the integrated circuit device 12 as a programmable logic device, such as a field-programmable gate array (FPGA). Further, it should be understood that the integrated circuit device 12 may be any other suitable type of programmable logic device (e.g., an ASIC and/or application-specific standard product). The integrated circuit device 12 may have input/output circuitry 42 for driving signals off device and for receiving signals from other devices via input/output pins 44. Interconnection resources 46, such as global and local vertical and horizontal conductive lines and buses, and/or configuration resources (e.g., hardwired couplings, logical couplings not implemented by user logic), may be used to route signals on integrated circuit device 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as the integrated circuit device 12, may include programmable elements 50 with the programmable logic 48. In some embodiments, at least some of the programmable elements 50 may be grouped into logic array blocks (LABs). As discussed above, a designer (e.g., a customer) may (re)program (e.g., (re)configure) the programmable logic 48 to perform one or more desired functions. By way of example, some programmable logic devices may be programmed or reprogrammed by configuring programmable elements 50 using mask programming arrangements, which is performed during semiconductor manufacturing. Other programmable logic devices are configured after semiconductor fabrication operations have been completed, such as by using electrical programming or laser programming to program programmable elements 50. In general, programmable elements 50 may be based on any suitable programmable technology, such as fuses, antifuses, electrically programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using input/output pins 44 and input/output circuitry 42. In one embodiment, the memory cells may be implemented as random-access-memory (RAM) cells. The use of memory cells based on RAM technology as described herein is intended to be only one example. Further, since these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Figure 3:
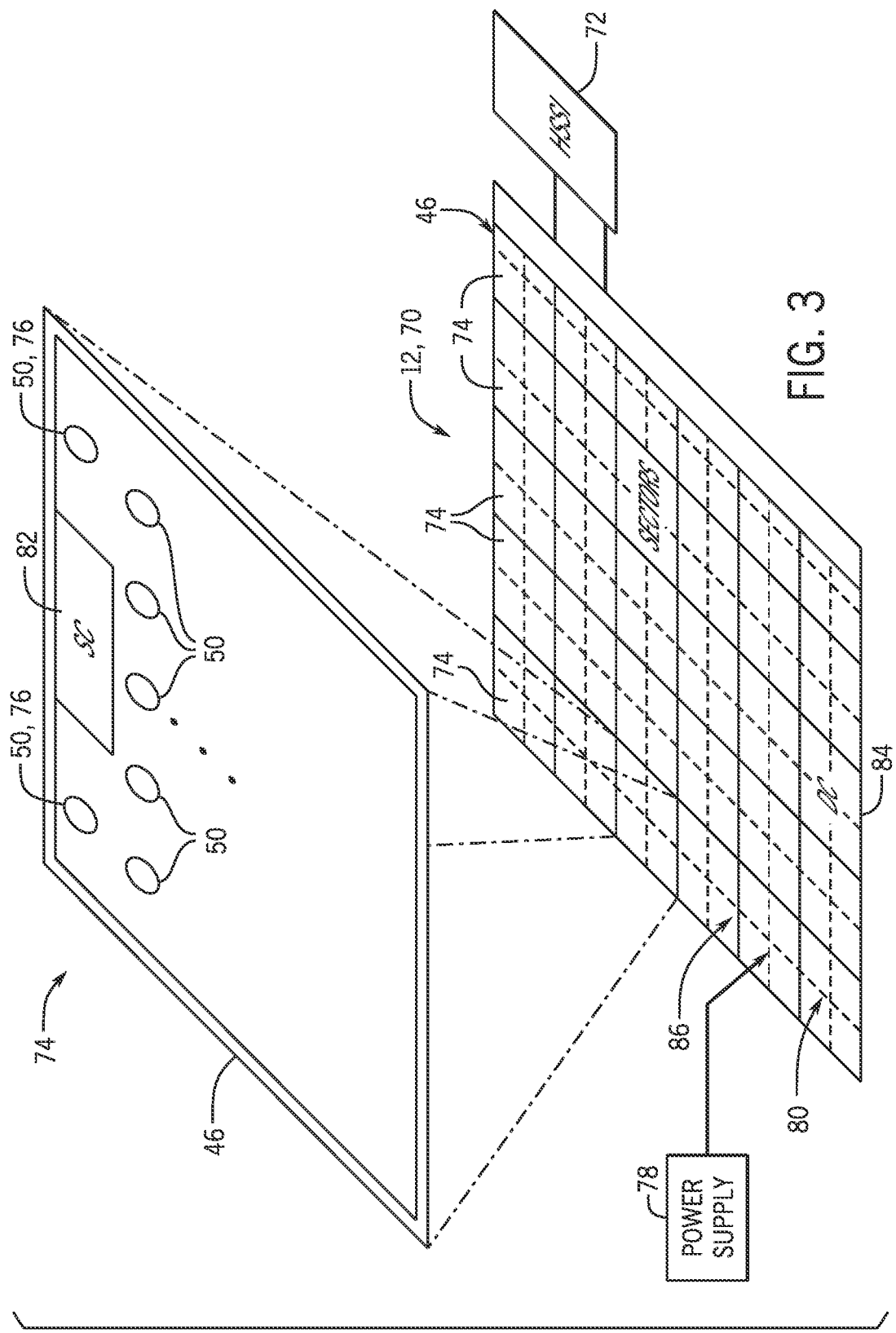
FIG. 3 is a diagram of programmable fabric of the integrated circuit device of FIG. 1, in accordance with an embodiment of the present disclosure.

The integrated circuit device 12 may include any programmable logic device such as a field programmable gate array (FPGA) 70, as shown in FIG. 3. For the purposes of this example, the FPGA 70 is referred to as an FPGA, though it should be understood that the device may be any suitable type of programmable logic device (e.g., an application-specific integrated circuit and/r application-specific standard product). In one example, the FPGA 70 is a sectorized FPGA of the type described in U.S. Patent Publication No. 2016/0049941, "Programmable Circuit Having Multiple Sectors," which is incorporated by reference in its entirety for all purposes. The FPGA 70 may be formed on a single plane. Additionally or alternatively, the FPGA 70 may be a three-dimensional FPGA having a base die and a fabric die of the type described in U.S. Pat. No. 10,833,679, "Multi-Purpose Interface for Configuration Data and User Fabric Data," which is incorporated by reference in its entirety for all purposes.

In the example of FIG. 3, the FPGA 70 may include transceiver 72 that may include and/or use input/output circuitry, such as input/output circuitry 42 in FIG. 2, for driving signals off the FPGA 70 and for receiving signals from other devices. Interconnection resources 46 may be used to route signals, such as clock or data signals, through the FPGA 70. The FPGA 70 is sectorized, meaning that programmable logic resources may be distributed through a number of discrete programmable logic sectors 74. Programmable logic sectors 74 may include a number of programmable logic elements 50 having operations defined by configuration memory 76 (e.g., CRAM).

A power supply 78 may provide a source of voltage (e.g., supply voltage) and current to a power distribution network (PDN) 80 that distributes electrical power to the various components of the FPGA 70. Operating the circuitry of the FPGA 70 causes power to be drawn from the power distribution network 80.

There may be any suitable number of programmable logic sectors 74 on the FPGA 70. Indeed, while 29 programmable logic sectors 74 are shown here, it should be appreciated that more or fewer may appear in an actual implementation (e.g., in some cases, on the order of 50, 100, 500, 1000, 5000, 10,000, 50,000 or 100,000 sectors or more). Programmable logic sectors 74 may include a sector controller (SC) 82 that controls operation of the programmable logic sector 74. Sector controllers 82 may be in communication with a device controller (DC) 84.

Sector controllers 82 may accept commands and data from the device controller 84 and may read data from and write data into its configuration memory 76 based on control signals from the device controller 84. In addition to these operations, the sector controller 82 may be augmented with numerous additional capabilities. For example, such capabilities may include locally sequencing reads and writes to implement error detection and correction on the configuration memory 76 and sequencing test control signals to effect various test modes.

The sector controllers 82 and the device controller 84 may be implemented as state machines and/or processors. For example, operations of the sector controllers 82 or the device controller 84 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow routines to have multiple variants depending on "modes" the local controller may be placed into. When the control program memory is implemented as RAM, the RAM may be written with new routines to implement new operations and functionality into the programmable logic sectors 74. This may provide usable extensibility in an efficient and easily understood way. This may be useful because new commands could bring about large amounts of local activity within the sector at the expense of only a small amount of communication between the device controller 84 and the sector controllers 82.

Sector controllers 82 thus may communicate with the device controller 84, which may coordinate the operations of the sector controllers 82 and convey commands initiated from outside the FPGA 70. To support this communication, the interconnection resources 46 may act as a network between the device controller 84 and sector controllers 82. The interconnection resources 46 may support a wide variety of signals between the device controller 84 and sector controllers 82. In one example, these signals may be transmitted as communication packets.

The use of configuration memory 76 based on RAM technology as described herein is intended to be only one example. Moreover, configuration memory 76 may be distributed (e.g., as RAM cells) throughout the various programmable logic sectors 74 of the FPGA 70. The configuration memory 76 may provide a corresponding static control output signal that controls the state of an associated programmable logic element 50 or programmable component of the interconnection resources 46. The output signals of the configuration memory 76 may be applied to the gates of metal-oxide-semiconductor (MOS) transistors that control the states of the programmable logic elements 50 or programmable components of the interconnection resources 46.

Figure 4:
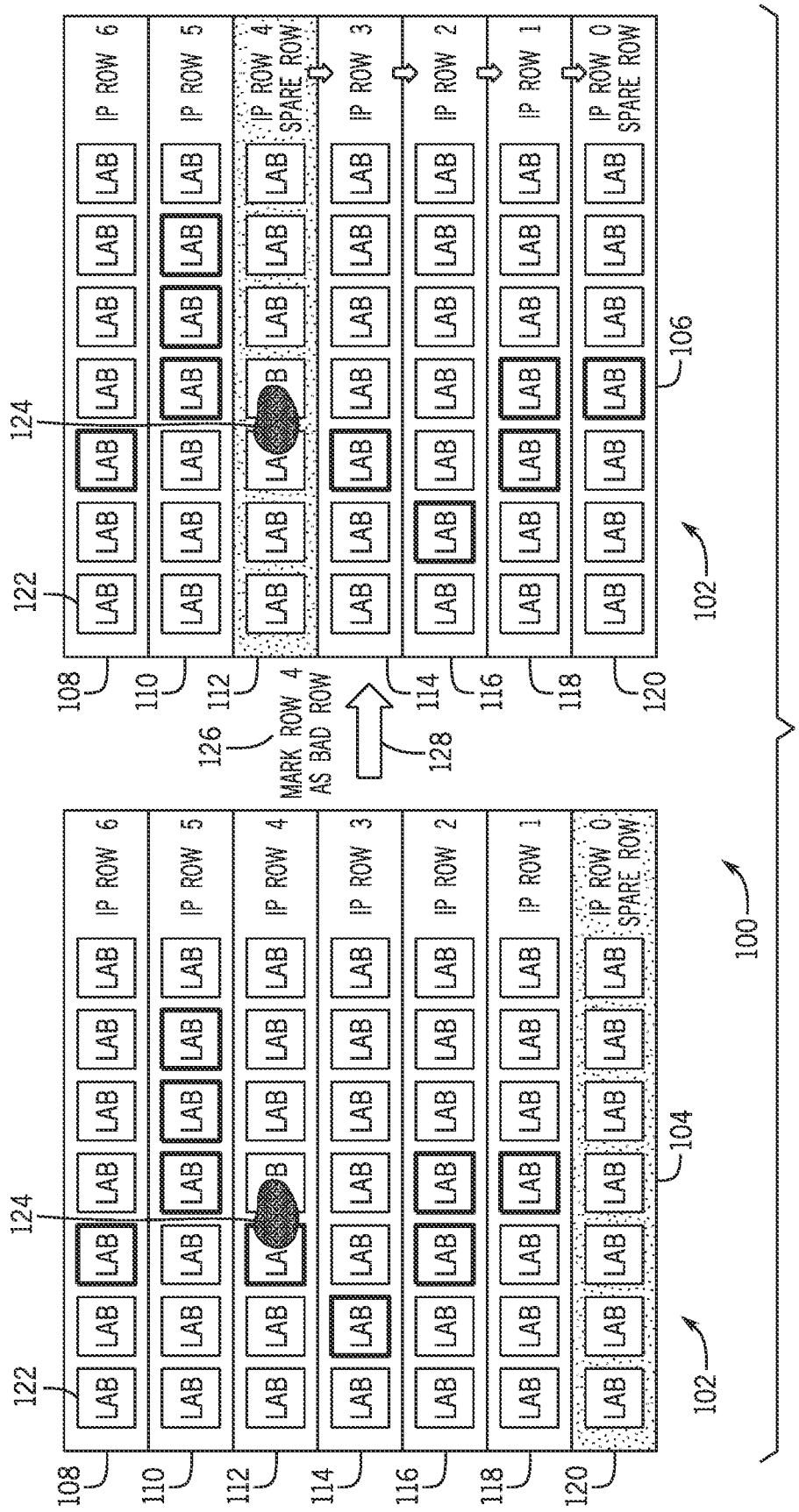
FIG. 4 is a block diagram of a repair of a two-dimensional array of logic array blocks (LABs) of the integrated circuit device of FIG. 1, in accordance with an embodiment of the present disclosure.

FIG. 4 is a block diagram 100 of a repair of an array 102 of logic array blocks (LABs) 122 from a pre-repair configuration 104 to a post-repair configuration 106 in the programmable fabric. The LABs 122 are arranged into rows 108, 110, 112, 114, 116, 118, and 120. The row 120 of LABs 122 may be a spare row that is used to perform repairs when one of the rows 108, 110, 112, 114, 116, or 118 fail. For example, when one or more LABs 122 fail in the row 112 fails, the device controller 84, sector controller(s) 82, and/or the host 18 may mark the row 112 as a bad row. The device controller 84, sector controller(s) 82, and/or the host 18 may cause the rows 112, 114, 116, and 118 to be respectively remapped to the rows 114, 116, 118, and 120.

Figure 5:
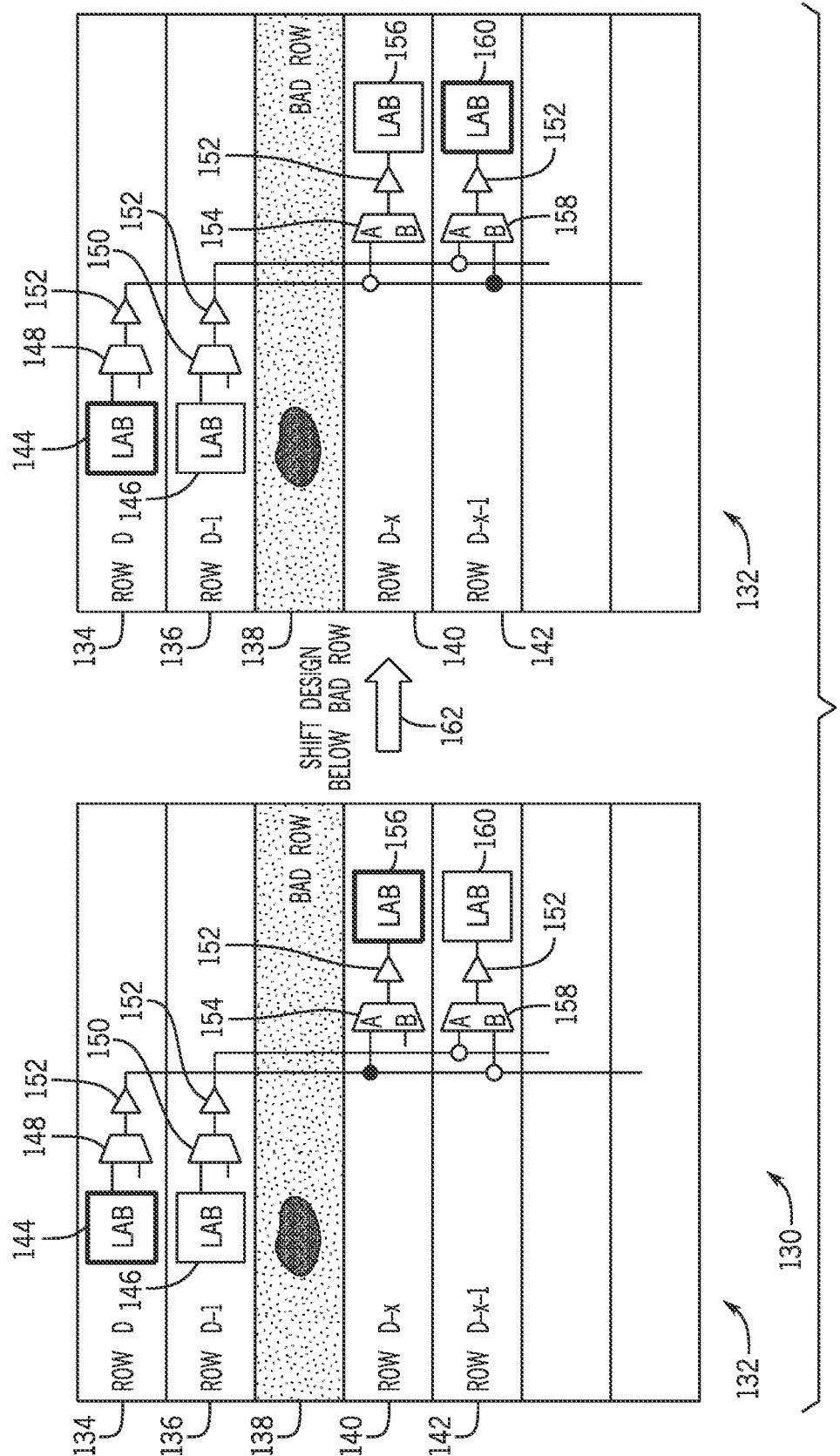
FIG. 5 is a schematic diagram of the repair circuitry of the integrated circuit device of FIG. 1 used to repair an entire row of the two-dimensional array of LABs in FIG. 4, in accordance with an embodiment of the present disclosure.

FIG. 5 illustrates a schematic diagram 130 of a repair of the array of LABs 132 using repair circuitry. The schematic diagram 130 includes rows 134, 136, 138, 140, and 142, but additional rows may be included in integrated circuit device 12 that may be omitted from the schematic diagram for simplicity of explanation. As illustrated, a LAB 144 in the row 134 may transmit data pre-repair through a multiplexer 148 as a LAB 146 in the row 136 transmits data pre-repair through a multiplexer 150. The multiplexers 148 and 150 may transmit respective data over busses and/or lines. Some of the bussed and/or lines may utilize one or more buffers 152. Pre-repair, one or more demultiplexers 154 may select data from the LAB 144 from a respective line/bus for a LAB 156. Similarly, one or more demultiplexers 158 may select data from the LAB 146 from a respective line/bus for a LAB 160. The device controller 84, sector controller(s) 82, and/or the host 18 may cause the multiplexer 148, the multiplexer 150, and/or the demultiplexers 154 and 158 to cause design shifting down a row below the row 138 that is bad. For instance, the LAB 156 draws data from another row (not shown) above the row 134 via the one or more demultiplexers 154, and the LAB 160 draws data from the row 134 instead of row 134 from before the repair. The shifting of data in the LAB 160 is performed using the one or more demultiplexers to draw data from respective lines and/or busses from the multiplexer 148. In other words, each demultiplexer enables its row to select between at least two rows enabling dynamic remapping.

If a whole row of LABs is remapped in the repair and only a single spare row is included, two failures in two different rows cannot be repaired for the integrated circuit device 12 causing the device to be faulty and/or unusable. To address such situations, a segmented LAB row repair scheme may be used. Segmentation reduces the unit size of block that is being repaired. By placing mux structures between two or more segments each segment can be treated independently. The simple row-based LAB row repair scheme can repair multiple defects only as long as they are all in the same lab row. Segmentation removes this constraint and now multiple defects in different lab row segments can be handled. To enable this segmentation, additional multiplexers/demultiplexers may be added between segments of rows. The addition of the multiplexers/demultiplexers may a very small area overhead with negligible performance impact especially when compared to the overhead required to place additional spare rows. Moreover, the multiplexer/demultiplexer structures can be implemented with zipper logic that services LAB segments on more than one side of the repair circuitry further reducing the overheard. For instance, repair circuitry between a left segment of LABs and a right segment of LABs may repair both segments. To accomplish this method of repairing on both sides, the repair circuitry may include a first set of multiplexers/demultiplexers for the first/left segment and a second set of multiplexers/demultiplexers for the second/right segment.

Figure 6:
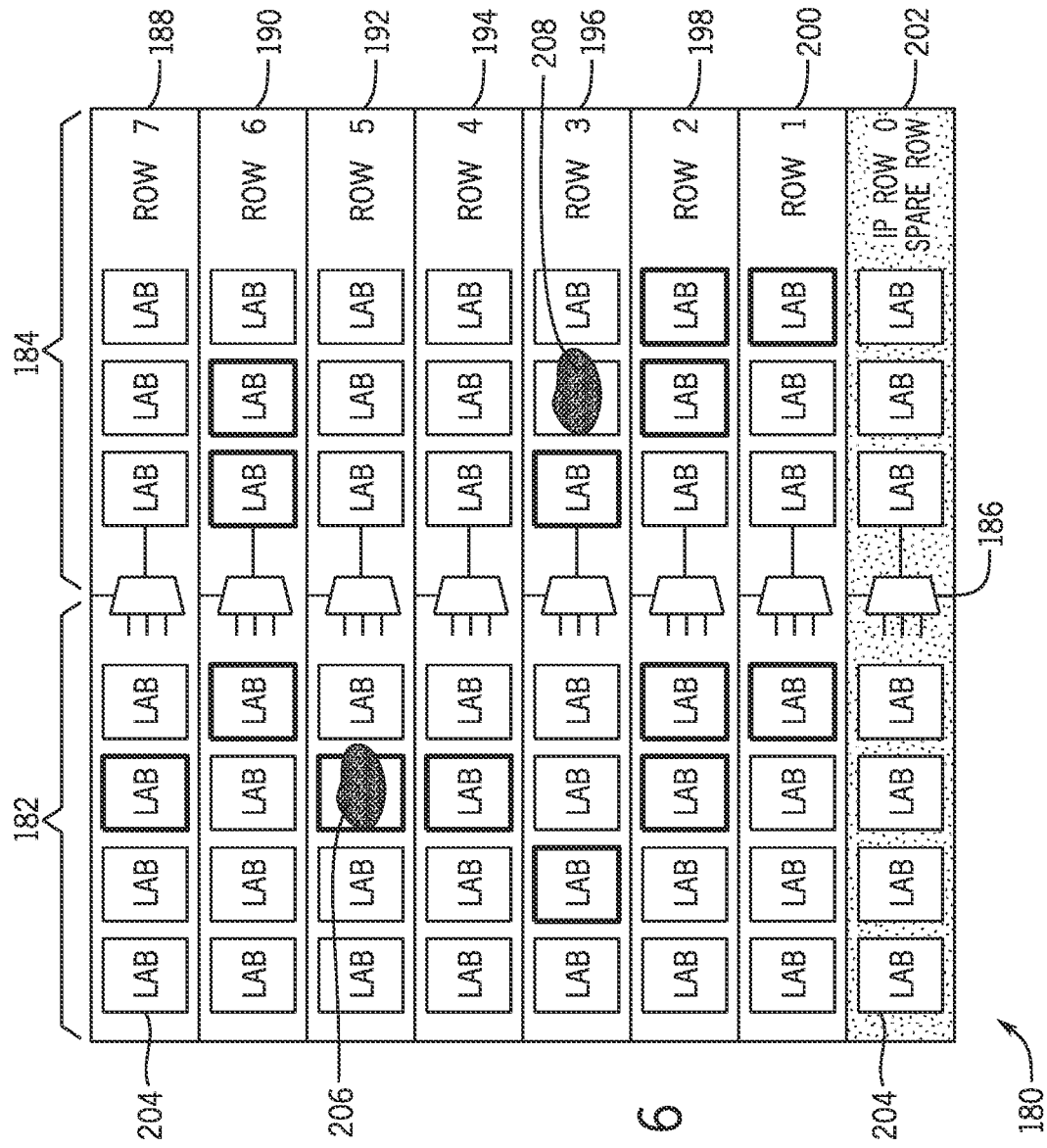
FIG. 6 is a block diagram of segmented repair circuitry that repairs a row of a two-dimensional array of LABs of the integrated circuit device of FIG. 1 in two or more segments, in accordance with an embodiment of the present disclosure.

FIG. 6 is a block diagram of an array 180 of LABs 204 divided into a first segment 182 and a second segment 184. The first segment 182 and the second segment 184 are divided by repair circuitry 186. In addition to being divided into two segments, the LABs 204 are grouped into rows 188, 190, 192, 194, 196, 198, 200, and 202. Although the illustrated array 180 includes 56 LABs 204 in two segments 182 and 184 and eight rows, some embodiments may include more segments, more ore fewer rows, and/or more or fewer LABs 204 per rows. Furthermore, although the segments 182 and 184 are illustrated as respectively containing four and three LABs 204, segments may include any suitable number of LABs 204, such as 2, 3, 4, 5, 6 or more LABs 204 with repair circuitry between segments (e.g., between first and second segments, between third and fourth segments, etc.). The smaller the segments, the more granularity of repairs are possible, but additional overhead of routing and multiplexers/demultiplexers. Thus, the number of LABs 204 may be selected to strike a level of balance desired for the manufactured integrated circuit device 12. The repair circuitry 186 may be used to remap configuration and/or data between LABs 204 in the programmable fabric of the integrated circuit device 12. For example, the repair circuitry 186 may be used to remap logic/communication paths in the first segment 182, the second segment 184, communications between the first and second segments 182 and 184, or any combination thereof. Although the illustrated embodiment of the repair circuitry 186 includes only a single set of multiplexers/demultiplexers, some embodiments may include additional sets of multiplexers (e.g., one for each row per segment serviced by the repair circuitry 186). Furthermore, as previously discussed the number of inputs to each multiplexer/demultiplexer in the repair circuitry 186 controls the flexibility for remapping. For instance, a two-input multiplexer may enable mapping one of two rows to a respective row. This number of inputs may change by implementation. More flexibility may be provided by including more inputs to the multiplexers. However, the additional flexibility requires more materials and/or space to implement the multiplexers having more inputs. Thus, a design choice may balance between the flexibility and space/material costs for each implementation.

The remapping using the repair circuitry 186 may be performed during manufacture by setting one or more fuses when a faulty LAB is detected during testing. Additionally or alternatively, the remapping may be conducted in the field using the repair circuitry 186 by having the device controller 84 and/or a sector controller 82 make the determination of failure and sending control signals to respective multiplexers to cause the remapping.

Figure 7:
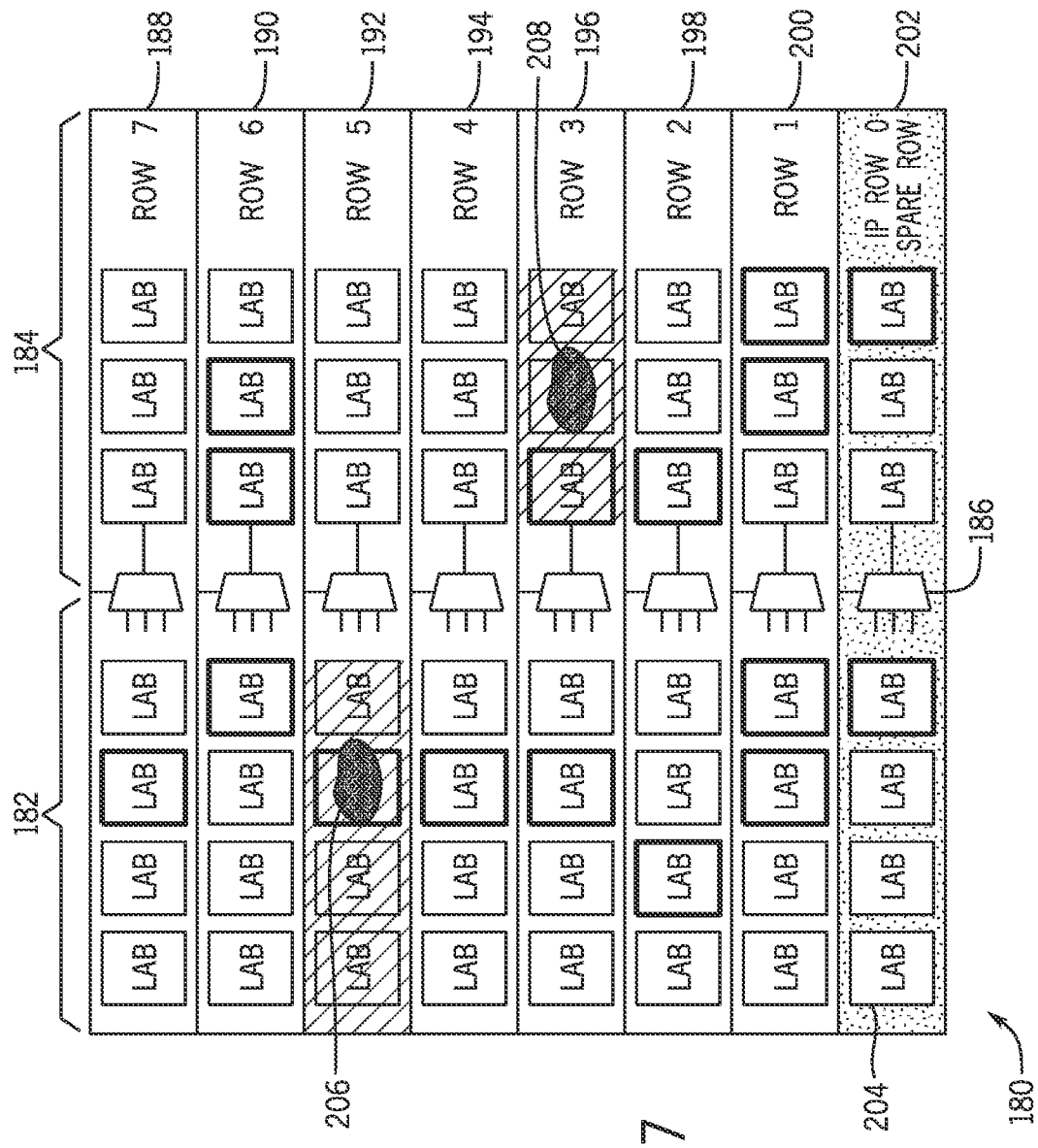
FIG. 7 is a block diagram of the two-dimensional array of FIG. 6 after the repair using the segmented repair circuitry, in accordance with an embodiment of the present disclosure.

As illustrated, a LAB 206 in the row 192 and in the first segment 182 and a LAB 208 in the row 196 and in the second segment 184 may have both failed. Since each of the segments 182 and 184 may be repaired independently, the portion of the rows 192-200 in the first segment 182 may be shifted down as part of a repair while the portion of the rows 196-200 in the second segment 184 may also be shifted down. FIG. 7 shows a result of the repair to the array 180. As illustrated, the portion of the rows 192-200 in the first segment 182 are shifted down to rows 194-202. Similarly, the portion of the rows 196-200 in the second segment 184 are shifted to rows 198-202. Accordingly, the portion of the row 192 in the first segment 182 that contains the faulty LAB 206 goes unused after the repair. Similarly, the portion of the row 196 in the second segment 184 that contains the faulty LAB 208 goes unused after the repair.

Figure 8:
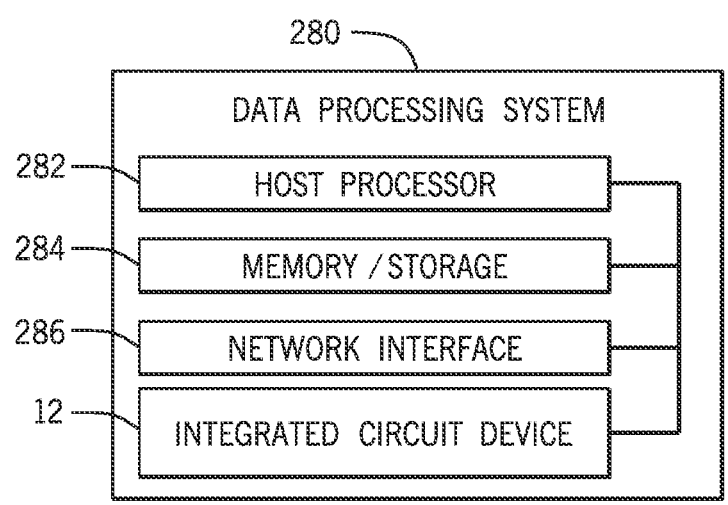
FIG. 8 is a block diagram of a data processing system, in accordance with an embodiment of the present disclosure.

The integrated circuit device 12 may be a data processing system or a component included in a data processing system. For example, the integrated circuit device 12 may be a component of a data processing system 280 shown in FIG. 8. The data processing system 280 may include a host processor 282 (e.g., a central-processing unit (CPU)), memory and/or storage circuitry 284, and a network interface 286. The data processing system 280 may include more or fewer components (e.g., electronic display, user interface structures, application specific integrated circuits (ASICs)). The host processor 282 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 280 (e.g., to perform debugging, data analysis, encryption, decryption, machine learning, video processing, voice recognition, image recognition, data compression, database search ranking, bioinformatics, network security pattern identification, spatial navigation, or the like). The memory and/or storage circuitry 284 may include random access memory (RAM), read-only memory (ROM), one or more hard drives, flash memory, or the like. The memory and/or storage circuitry 284 may hold data to be processed by the data processing system 280. In some cases, the memory and/or storage circuitry 284 may also store configuration programs (bitstreams) for programming the integrated circuit device 12. The network interface 286 may allow the data processing system 280 to communicate with other electronic devices. The data processing system 280 may include several different packages or may be contained within a single package on a single package substrate.

In one example, the data processing system 280 may be part of a data center that processes a variety of different requests. For instance, the data processing system 280 may receive a data processing request via the network interface 286 to perform acceleration, debugging, error detection, data analysis, encryption, decryption, machine learning, video processing, voice recognition, image recognition, data compression, database search ranking, bioinformatics, network security pattern identification, spatial navigation, digital signal processing, or some other specialized tasks.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

Example Embodiments

EXAMPLE EMBODIMENT 1. A programmable logic device comprising a plurality of logic array blocks comprising a plurality of programmable elements, wherein the plurality of logic array blocks is arranged in a plurality of rows that are segmented into a plurality of segments; and repair circuitry disposed between the plurality of segments that remaps logic within a first segment of the plurality of segments when a first logic array block of the plurality of logic array blocks has failed, wherein the first segment comprises the first logic array block.

EXAMPLE EMBODIMENT 2. The programmable logic device of example embodiment 1, wherein the repair circuitry is disposed along the plurality of rows between the plurality of segments.

EXAMPLE EMBODIMENT 3. The programmable logic device of example embodiment 1, wherein the first segment is to the left of the repair circuitry, and the plurality of segments comprises a second segment to the right of the repair circuitry.

EXAMPLE EMBODIMENT 4. The programmable logic device of example embodiment 1, wherein the repair circuitry comprises a respective multiplexer for each row of the plurality of rows.

EXAMPLE EMBODIMENT 5. The programmable logic device of example embodiment 1, wherein the repair circuitry comprises a first multiplexer that remaps the first segment of a row of the plurality of rows; and a second multiplexer that remaps in a second segment of the row, wherein the first and second multiplexers are between the first and second segments.

EXAMPLE EMBODIMENT 6. The programmable logic device of example embodiment 1, wherein the repair circuitry remapping of logic within respective segments of the plurality of segments is preformed independently of remapping of other segments of the plurality of segments.

EXAMPLE EMBODIMENT 7. The programmable logic device of example embodiment 1, wherein remapping logic within the first segment comprises remapping logic of a first row in the first segment to a second row of the first segment.

EXAMPLE EMBODIMENT 8. The programmable logic device of example embodiment 7, wherein the second row comprises a spare row during manufacture of the programmable logic device.

EXAMPLE EMBODIMENT 9. The programmable logic device of example embodiment 7, wherein the repair circuitry remaps logic within a second segment when the second segment comprises a second logic block of the plurality of logic blocks that has failed, wherein remapping logic within the second segment comprises remapping logic of the first row in the second segment to a second row of the second segment.

EXAMPLE EMBODIMENT 10. The programmable logic device of example embodiment 9, wherein the second row comprises a spare row during manufacture of the programmable logic device.

EXAMPLE EMBODIMENT 11. A programmable logic device comprising: a first row of logic array blocks comprising a first plurality of programmable elements; a second row of logic array blocks comprising a second plurality of programmable elements, wherein the first and second rows of logic array blocks are segmented into a first segment and a second segment; and repair circuitry disposed between the first and second segments, wherein the repair circuitry remaps logic from the first row to a third row of logic array blocks within the first segment when a logic array block of the first row of logic array blocks in the first segment has failed.

EXAMPLE EMBODIMENT 12. The programmable logic device of example embodiment 11, wherein the repair circuitry remaps logic from the first row to the third row within the second segment when a logic array block of the first row of logic array blocks in the second segment has failed.

EXAMPLE EMBODIMENT 13. The programmable logic device of example embodiment 11, wherein the third row is segmented into the first and second segments.

EXAMPLE EMBODIMENT 14. The programmable logic device of example embodiment 11, wherein the first and second rows of logic array blocks are segmented into the first segment, the second segment, a third segment, and a fourth segment.

EXAMPLE EMBODIMENT 15. The programmable logic device of example embodiment 14, comprising additional repair circuitry disposed between the third segment and the fourth segment.

EXAMPLE EMBODIMENT 16. A method comprising: determining that a first logic array block in a first segment of logic array blocks of a programmable logic device has failed, wherein the first logic array block is in a first row of the logic array blocks; determining that a second logic array block in a second segment of the logic array blocks has failed, wherein the second logic array block is in a second row of the logic array blocks; remapping, using repair circuitry, a first set of logic within the first segment; and remapping, using the repair circuitry, a second set of logic within the second segment.

EXAMPLE EMBODIMENT 17. The method of example embodiment 16, wherein remapping the first set of logic comprises remapping a first portion of a third row in the first segment to a first portion of a fourth row in the first segment, and remapping the second set of logic comprises remapping a second portion of the third row in the second segment to a second portion of the fourth row in the second segment.

EXAMPLE EMBODIMENT 18. The method of example embodiment 17, wherein the fourth row comprises a spare row during manufacture of the programmable logic device, and the remapping comprises setting one or more fuses during the manufacture of the programmable logic device.

EXAMPLE EMBODIMENT 19. The method of example embodiment 16, wherein remapping the first set of logic comprises remapping a portion of the second row in the second segment to a portion of a third row in the second segment.

EXAMPLE EMBODIMENT 20. The method of example embodiment 16, wherein determining that the first logic array block and the second logic array blocks have failed is performed by one or more sector controllers of the programmable logic device or a device controller of the programmable logic device, wherein remapping the first and second sets of logic comprises the one or more sector controllers or the device controller causing control signals to be sent to multiplexers or demultiplexers of the repair circuitry to cause the remapping of the first and second sets of logic.

What is claimed is:
1. A programmable logic device comprising:
a plurality of logic array blocks comprising a plurality of programmable elements, wherein the plurality of logic array blocks is arranged in a plurality of rows that are each segmented into a plurality of segments that are each smaller than a row and that are separately repairable independent of other segments in the same row; and repair circuitry disposed between the plurality of segments that remaps logic within a first segment of the plurality of segments when a first logic array block of the plurality of logic array blocks has failed, wherein the first segment comprises the first logic array block.

2. The programmable logic device of claim 1, wherein the repair circuitry is disposed along the plurality of rows between the plurality of segments.

3. The programmable logic device of claim 1, wherein the first segment is to the left of the repair circuitry, and the plurality of segments comprises a second segment to the right of the repair circuitry.

4. The programmable logic device of claim 1, wherein the repair circuitry comprises a respective multiplexer for each row of the plurality of rows.

5. The programmable logic device of claim 1, wherein the repair circuitry comprises:
    a first multiplexer that remaps the first segment of a row of the plurality of rows; and
    a second multiplexer that remaps in a second segment of the row, wherein the first and second multiplexers are between the first and second segments.

6. The programmable logic device of claim 1, wherein the repair circuitry remapping of logic within respective segments of the plurality of segments is performed independently of remapping of other segments of the plurality of segments.

7. The programmable logic device of claim 1, wherein remapping logic within the first segment comprises remapping logic of a first row in the first segment to a second row of the first segment.

8. The programmable logic device of claim 7, wherein the second row comprises a spare row during manufacture of the programmable logic device.

9. The programmable logic device of claim 7, wherein the repair circuitry remaps logic within a second segment when the second segment comprises a second logic block of the plurality of logic array blocks that has failed, wherein remapping logic within the second segment comprises remapping logic of the first row in the second segment to a second row of the second segment.

10. The programmable logic device of claim 9, wherein the second row comprises a spare row during manufacture of the programmable logic device.

11. A programmable logic device comprising:
    a first row of logic array blocks comprising a first plurality of programmable elements;
    a second row of logic array blocks comprising a second plurality of programmable elements, wherein the first and second rows of logic array blocks are segmented into a first segment and a second segment that are each smaller than a row and that are separately repairable independent of other segments in the same row; and
    repair circuitry disposed between the first and second segments, wherein the repair circuitry remaps logic from the first row to a third row of logic array blocks within the first segment when a logic array block of the first row of logic array blocks in the first segment has failed.

12. The programmable logic device of claim 11, wherein the repair circuitry remaps logic from the first row to the third row within the second segment when a logic array block of the first row of logic array blocks in the second segment has failed.

13. The programmable logic device of claim 11, wherein the third row is segmented into the first and second segments.

14. The programmable logic device of claim 11, wherein the first and second rows of logic array blocks are segmented into the first segment, the second segment, a third segment, and a fourth segment.

15. The programmable logic device of claim 14, comprising additional repair circuitry disposed between the third segment and the fourth segment.

16. A method comprising:
    determining that a first logic array block in a first segment of logic array blocks of a programmable logic device has failed, wherein the first logic array block is in a first row of the logic array blocks;
    determining that a second logic array block in a second segment of the logic array blocks has failed, wherein the second logic array block is in a second row of the logic array blocks;
    remapping, using repair circuitry, a first set of logic within the first segment, wherein the first segment is smaller than the first row and repairable independent of whether another segment of the first row is repaired; and
    remapping, using the repair circuitry, a second set of logic within the second segment, whether the second segment is smaller than the second row and repairable independent of whether another segment of the second row is repaired.

17. The method of claim 16, wherein remapping the first set of logic comprises remapping a first portion of a third row in the first segment to a first portion of a fourth row in the first segment, and remapping the second set of logic comprises remapping a second portion of the third row in the second segment to a second portion of the fourth row in the second segment.

18. The method of claim 17, wherein the fourth row comprises a spare row during manufacture of the programmable logic device, and the remapping comprises setting one or more fuses during the manufacture of the programmable logic device.

19. The method of claim 16, wherein remapping the first set of logic comprises remapping a portion of the second row in the second segment to a portion of a third row in the second segment.

20. The method of claim 16, wherein determining that the first logic array block and the second logic array block have failed is performed by one or more sector controllers of the programmable logic device or a device controller of the programmable logic device, wherein remapping the first and second sets of logic comprises the one or more sector controllers or the device controller causing control signals to be sent to multiplexers or demultiplexers of the repair circuitry to cause the remapping of the first and second sets of logic.

* * * * *